(12) United States Patent
Espiritu et al.

(10) Patent No.: US 8,912,046 B2
(45) Date of Patent: Dec. 16, 2014

(54) INTEGRATED CIRCUIT PACKAGING SYSTEM WITH LEAD FRAME AND METHOD OF MANUFACTURE THEREOF

(75) Inventors: Emmanuel Espiritu, Singapore (SG); Henry Descalzo Bathan, Singapore (SG); Zigmund Ramirez Camacho, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 50 days.

(21) Appl. No.: 13/284,654

(22) Filed: Oct. 28, 2011

(65) Prior Publication Data
US 2012/0104585 A1  May 3, 2012

Related U.S. Application Data

(60) Provisional application No. 61/407,881, filed on Oct. 28, 2010.

(51) Int. Cl.
| H01L 21/00 | (2006.01) |
| H01L 21/48 | (2006.01) |
| H01L 23/495 | (2006.01) |
| H01L 23/00 | (2006.01) |
| H01L 23/31 | (2006.01) |

(52) U.S. Cl.
CPC ... H01L 21/4832 (2013.01); H01L 2924/01079 (2013.01); H01L 24/92 (2013.01); H01L 2224/2919 (2013.01); H01L 2224/48091 (2013.01); H01L 23/3107 (2013.01); H01L 24/85 (2013.01); H01L 2224/73265 (2013.01); H01L 2224/85439 (2013.01); H01L 2224/85455 (2013.01); H01L 24/49 (2013.01); H01L 2224/49433 (2013.01); H01L 24/29 (2013.01); H01L 2224/45144 (2013.01); H01L 2224/32245 (2013.01); H01L 2224/92247 (2013.01); H01L 2224/48247 (2013.01); H01L 24/45 (2013.01); H01L 24/32 (2013.01); H01L 2224/85444 (2013.01); H01L 24/73 (2013.01); H01L 23/49541 (2013.01); H01L 24/48 (2013.01); H01L 2224/85464 (2013.01); H01L 23/49582 (2013.01)
USPC ..... 438/111; 438/112; 257/676; 257/E23.043

(58) Field of Classification Search
USPC ................ 438/111, 112; 257/676, E23.043
See application file for complete search history.

(56) References Cited

U.S. PATENT DOCUMENTS

| 6,348,726 B1 | 2/2002 | Bayan et al. |
| 6,882,035 B2 | 4/2005 | Tatt et al. |
| 7,060,535 B1 | 6/2006 | Sirinorakul et al. |
| 7,786,557 B2 * | 8/2010 | Hsieh et al. .................. 257/676 |
| 7,790,500 B2 | 9/2010 | Ramos et al. |
| 7,858,443 B2 | 12/2010 | Powell et al. |
| 2009/0230524 A1 | 9/2009 | Chien et al. |
| 2010/0044843 A1 | 2/2010 | Chang Chien et al. |
| 2010/0044850 A1 * | 2/2010 | Lin et al. ....................... 257/690 |

* cited by examiner

*Primary Examiner* — Amar Movva
(74) *Attorney, Agent, or Firm* — Ishimaru & Associates LLP

(57) ABSTRACT

A method of manufacture of an integrated circuit packaging system includes: forming signal contacts; forming a power bar having a power bar terminal, the power bar terminal formed in a staggered position relative to the signal contacts; depositing a terminal pad on the power bar terminal; depositing a contact pad on one of the signal contacts; coupling an integrated circuit die to the power bar terminal and the signal contacts; and forming a package body on the integrated circuit die.

10 Claims, 5 Drawing Sheets

INTEGRATED CIRCUIT PACKAGING SYSTEM WITH LEAD FRAME AND METHOD OF MANUFACTURE THEREOF

CROSS-REFERENCE TO RELATED APPLICATION(S)

This application claims the benefit of U.S. Provisional Patent Application Ser. No. 61/407,881 filed Oct. 28, 2010, and the subject matter thereof is incorporated herein by reference thereto.

TECHNICAL FIELD

The present invention relates generally to an integrated circuit packaging system, and more particularly to a system for integrated circuit packaging with a lead frame structure.

BACKGROUND ART

In today's consumer electronics industry, higher levels of integration are causing more and more difficulties in packaging the integrated circuit dies. The integration of features may dramatically increase the number of input/output (I/O) connections for a package.

Semiconductor devices are typically fabricated on dies that include a number of connection pads for connecting the circuitry contained on the die to external circuitry. A die is normally packaged in an encapsulating material to protect the die and to provide connections between the pads on the die and connectors that are better adapted for making connections to the external circuitry via traces on printed circuit boards and the like.

One class of semiconductor package utilizes a thin metal carrier that is commonly referred to as a "lead frame" to provide the connections between the die and the connectors that mate with external connectors on the printed circuit board. In this type of package, the die is typically attached to one portion of the lead frame. Thin gold wires are then connected between each pad on the die and a corresponding internal connector located on the periphery of the lead frame using a wire-bonding process. The lead frame, die, and connecting wires are then encapsulated in a plastic material that protects the die and provides mechanical strength.

While this type of package is economical, it has a number of disadvantages. First, the I/O connections to the die circuitry are located around the periphery of the lead frame. This arrangement limits the number of I/O connections that can be made to the die. As integrated circuits become more complex, this limitation becomes more troublesome.

Second, power and ground connections are typically made through pins that are similar to the I/O pins. The power connections must run from the peripheral connectors of the lead frame to the die via relatively long wires. This limits the current that can be provided to the chip. This can be particularly problematic in high power circuitry.

Third, the amount of heat that can be dissipated by the package is limited. The encapsulating material impedes heat dissipation via the top surface of the package. While the die is attached to a pad in the lead frame pad, the lead frame sits on the printed circuit board. The amount of heat that can be transferred depends on the contact area and heat resistance of that area. In general, the heat leaving via the lead frame pad is impeded by poor thermal connections between the bottom of the package and the printed circuit board.

Thus, a need still remains for manufacturing an integrated circuit packaging system having an effective path for power.

In view of the above, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: forming signal contacts; forming a power bar having a power bar terminal, the power bar terminal formed in a staggered position relative to the signal contacts; depositing a terminal pad on the power bar terminal; depositing a contact pad on the signal contacts; coupling an integrated circuit die to the power bar terminal and the signal contacts; and forming a package body on the integrated circuit die.

The present invention provides an integrated circuit packaging system including: signal contacts including: a contact body, and a contact pad on the contact body; a power bar including: a power bar terminal, the power bar terminal formed in a staggered position relative to the signal contacts, and a terminal pad on the power bar terminal; an integrated circuit die coupled to the power bar terminal and the signal contacts; and a package body on the integrated circuit die and partially covering the power bar terminal and the signal contacts.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
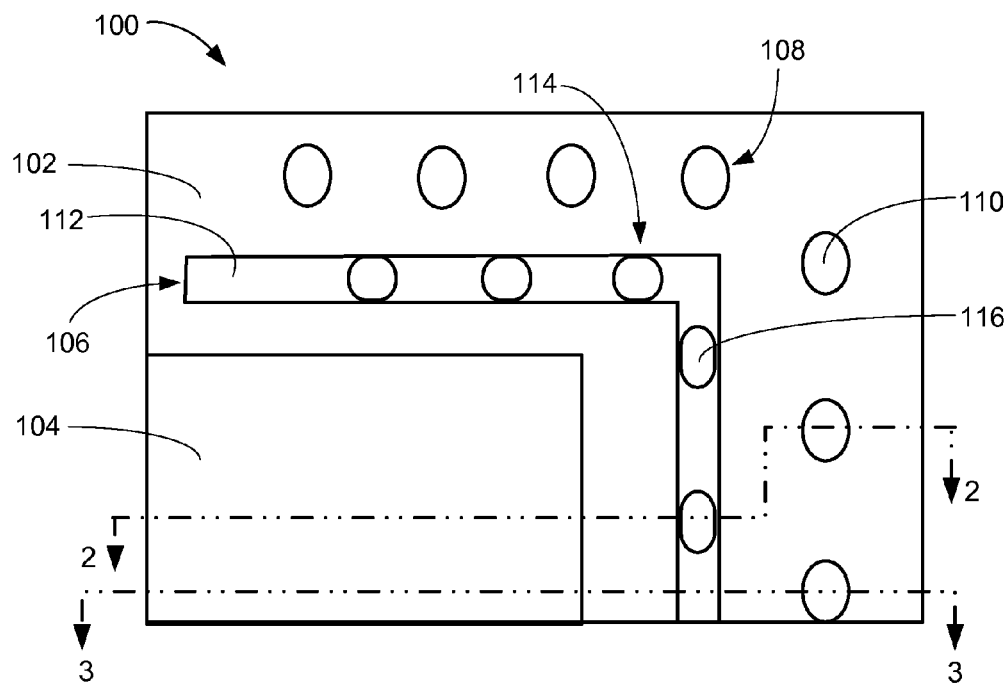
FIG. 1 is a partial bottom view of an integrated circuit packaging system in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals.

For expository purposes, the term "horizontal" as used herein is defined as a plane parallel to the plane or surface of the active side of the integrated circuit die, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements or components with no intervening material.

The term "processing" as used herein includes deposition of material or photoresist, patterning, plating, exposure, development, etching, cleaning, and/or removal of the material or photoresist as required in forming a described structure.

Referring now to FIG. 1, therein is shown a partial bottom view of an integrated circuit packaging system 100 in an embodiment of the present invention. The integrated circuit packaging system 100 is shown having a package body 102, a die paddle 104, a power bar 106, and signal contacts 108. The package body 102 is defined as a structure on integrated circuit components for electrical and environmental protection and to provide a hermetic seal. For example, the package body 102 can be a material such as film assisted molding, epoxy molding compound, or other protective molding. The package body 102 can function to protect sensitive components from moisture, dust and other contamination.

The die paddle 104 can provide structural support for integrated circuit components. The die paddle 104 can function in other ways. For example, the die paddle 104 can connect to a next level system (not shown) or to ground or can function as a heat sink. The die paddle 104 can be partially embedded in the package body 102.

The signal contact 108 is defined as a standalone interconnect structure. The signal contact 108 includes a contact pad 110. The signal contact 108 can function as an external connection to other systems for integrated circuit components. For example, the signal contact 108 can connect to a next level system (not shown). The signal contact 108 can be partially embedded in the package body 102.

The contact pad 110 is defined as a conductive material on the bottom of the signal contact 108. The contact pad 110 can be a thin layer of conductive metal. The contact pad 110 can cover the bottom of the signal contact 108 and can be planar.

The contact pad 110 can be formed in a number of ways. For example, the contact pad 110 can be formed by a process such as sputtering, electroplating, or chemical vapor deposition (CVD). The contact pad 110 can be made from a metal such as gold, silver, nickel, palladium, an alloy thereof, or another solder-wettable material.

The power bar 106 is defined as a linear conductive structure for carrying current to integrated circuit components or to ground. The power bar 106 includes a power bar body 112, a power bar terminal 114, and a terminal pad 116. The power bar 106 can be larger in size than the signal contacts 108, and can extend lengthwise parallel to the outline of the integrated circuit packaging system 100. The power bar 106 can be located adjacent to the die paddle 104. The power bar 106 can take many different shapes. For example, the power bar 106 can be a long rectangle, in an L-shape, or in the shape of a hollow square that surrounds the die paddle 104.

The power bar body 112 is defined as the base structure of the power bar 106 from which the power bar terminal 114 can be formed. The power bar body 112 can be made from many different materials such as copper, tin, zinc, or an alloy thereof. The shape of the power bar body 112 is the same as the shape of the power bar 106 without the power bar terminal 114. The power bar body 112 can be embedded in the package body 102 but can also be exposed from the package body 102. The exposed surface of the power bar body 112 having no protective coating can be coplanar with the bottom surface of the package body 102. The exposed surface of the power bar body 112 can have physical signs of a removal process. For example, if part of the power bar body 112 was removed by an etching process, the surface can be slightly rough due to action of the etchant used.

The power bar terminal 114 is defined as an integral part of the power bar 106 extending from the power bar body 112 that functions as an external connector. The power bar terminal 114 can extend from the power bar body 112 perpendicular to the plane of the package body 102. The power bar terminal 114 can extend from the power bar body 112 at the plane of the package body 102 to the same distance from the package body 102 as the signal contacts 108. The power bar terminal 114 can be made from the same materials as the power bar 106.

The power bar terminal 114 can be formed from a portion of the power bar 106 that is covered by the terminal pad 116. The portion of the power bar 106 not embedded in the package body 102 and not covered by the terminal pad 116 can be removed so as to separate instances of the power bar terminal 114. The power bar terminal 114 can be positioned relative to the signal contacts 108 so that the power bar terminal 114 and the signal contacts 108 are in a staggered formation, i.e., the power bar terminal 114 is located so the closest instance of the signal contact 108 is located diagonally from the power bar terminal 114 relative to the sides of the package body 102.

The terminal pad 116 is defined as a conductive material on the bottom of the power bar terminal 114. The terminal pad 116 can be a thin layer of conductive metal. The terminal pad 116 can be selectively located on the surface of the power bar terminal 114 exposed from the package body and parallel to the plane of the package body. The terminal pad 116 can be planar. Instances of the terminal pad 116 can be spaced away from each other. The terminal pad 116 and another of the terminal pad 116 can be formed on and along the power bar 112 and the power bar body 112. The terminal pad 116 and another of the terminal pad 116 can be formed in a staggered position relative to the signal contacts 108. The terminal pad 116 and another of the terminal pad 116 can be formed directly on the power bar terminal 114 directly adjacent and along the power bar 112.

The terminal pad 116 can be formed in a number of ways. For example, the terminal pad 116 can be formed by a process such as sputtering, electroplating, or chemical vapor deposition (CVD). The terminal pad 116 can be made from a metal such as gold, silver, nickel, palladium, an alloy thereof, or another solder-wettable material. The surfaces of the terminal pad 116 and the power bar 106 not covered by the terminal pad 116 can be unattractive to solder.

It has been discovered that the power bar terminal 114 and the signal contacts 108 being positioned in a staggered formation can prevent electrical shorts from solder bridging. For example, the staggered placement of the terminal pad 116 and the signal contacts 108 can increase the spacing between the terminal pad 116 and the signal contacts 108, there is a decreased chance of solder bridging between the terminal pad 116 and the signal contacts 108. The decreasing size of packages coupled with the corresponding decrease in pitch between the power bar 106 and the signal contacts 108 means that staggered contact points for solder can increase reliability without decreasing the effectiveness of the power bar 106.

It has also been discovered that the power bar terminal 114 and the signal contacts 108 being positioned in a staggered formation can allow for a greater density of the signal contacts 108 and structures that function as the power bar 106. For example, because of the decreased risk of solder bridging between the power bar 106 having the power bar terminal 114 and the signal contacts 108 due to staggered spacing, connection structures on the bottom of the integrated circuit packaging system 100 can be packed more closely than if the power bar 106 did not have the power bar terminals 114.

Figure 2:
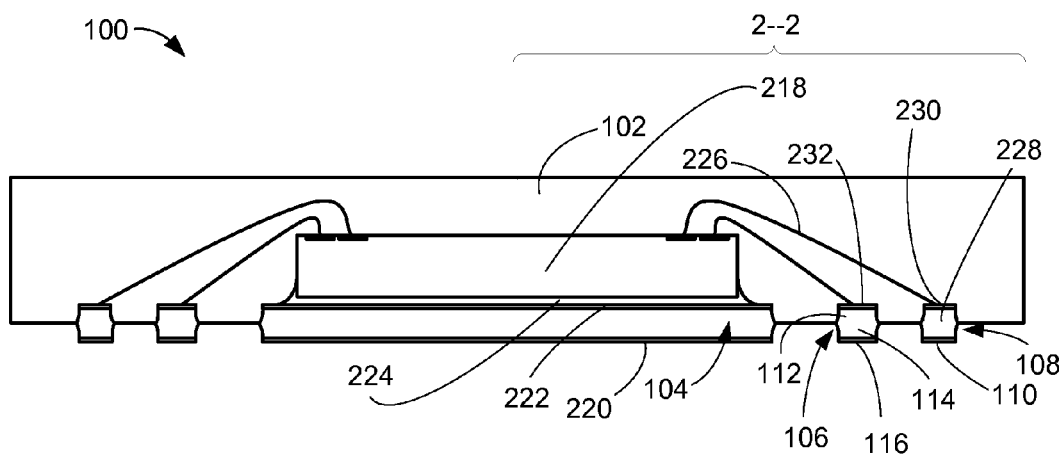
FIG. 2 is a cross-sectional view of the integrated circuit packaging system 100 with a partial cross-sectional view along the section line 2-2 of FIG. 1 marked by the bracket 2-2.

Referring now to FIG. 2, therein is shown a cross-sectional view of the integrated circuit packaging system 100 with a partial cross-sectional view along the section line 2-2 of FIG. 1 marked by the bracket 2-2. The integrated circuit packaging system 100 is shown having an integrated circuit die 218, the package body 102, the die paddle 104, the power bar 106, and the signal contacts 108. The package body 102 is defined as a structure on integrated circuit components for electrical and environmental protection and to provide a hermetic seal. For example, the package body 102 can be a material such as film assisted molding, epoxy molding, or other protective molding. The package body 102 can function to protect sensitive components from moisture, dust and other contamination.

The die paddle 104 can provide structural support for integrated circuit components. The die paddle 104 can function in other ways. For example, the die paddle 104 can connect to a next level system (not shown) or to ground or can function as a heat sink. The die paddle 104 can be made from many different materials such as copper, tin, zinc, or an alloy thereof. The die paddle 104 can be partially embedded in the package body 102. For example, half of the die paddle 104 can be embedded in the package body 102, and the other half of the die paddle 104 can be exposed from the package body 102.

The die paddle 104 can have a die paddle pad 220 and a die attach pad 222. The die attach pad 222 is defined as the location upon which the integrated circuit die 218 is attached. The die attach pad 222 can be a thin layer of conductive metal. The die attach pad 222 can fully cover the top surface of the die paddle 104.

The die paddle pad 220 is defined as a conductive metal on the bottom surface of the die paddle 104. The die paddle pad 220 can be a thin layer of conductive metal. The die paddle pad 220 fully covers the bottom surface of the die paddle 104. The bottom surface of the die paddle 104 is the surface of the die paddle 104 that is exposed from the package body 102.

The die paddle pad 220 can be formed in a number of ways. For example, the die paddle pad 220 can be formed by a process such as sputtering, electroplating, or chemical vapor deposition (CVD). The die paddle pad 220 can be made from a metal such as gold, silver, nickel, palladium, an alloy thereof, or a solder-wettable material.

The integrated circuit die 218 is defined as a chip containing active circuitry. The integrated circuit die 218 is attached to the die attach pad 222 with a die attach adhesive 224. The integrated circuit die 218 is positioned on the die attach adhesive 224 above the die attach pad 222. The die attach adhesive 224 is defined as a substance used to bond two or more solid elements together. The die attach adhesive 224 can be a resin, glue, paste, cement, putty, or a polyvinyl resin emulsion, for example. The die attach adhesive 224 can partially cover the die attach pad 222 and can partially cover the sides of the integrated circuit die 218.

The integrated circuit die 218 can be attached to the die attach pad 222 with the passive side facing down towards the die paddle 104 and the active side facing up away from the die paddle 104. The integrated circuit die 218 can be connected to the power bar 106 and the signal contact 108 with bond wires 226.

The signal contact 108 is defined as a standalone interconnect structure. The signal contact 108 includes a contact body 228, the contact pad 110, and a bond pad 230. The signal contact 108 can function as an external connection to other systems for the integrated circuit die 218. For example, the signal contact 108 can connect to a next level system (not shown) with an external interconnect (not shown) such as solder balls, conductive columns, or metal pillars. The signal contact 108 can be partially embedded in the package body 102, leaving part of the contact body 228 and the contact pad 110 exposed. For example, half of the contact body 228 can be embedded in the package body 102.

The contact body 228 is defined as the base structure of the signal contact 108 on which the contact pad 110 and the bond pad 230 can be formed. The contact body 228 can be made from many different materials such as copper, tin, zinc, or an alloy thereof. The contact body 228 can take various shapes. For example, the contact body 228 can have a distinctive shape as a result of a removal or etching process where there is a protrusion extending from the non-horizontal side of the contact body 228. The point of the protrusion which extends furthest from the contact body 228 can be halfway in between the contact pad 110 and the bond pad 230.

The contact pad 110 is defined as a conductive material on the bottom of the signal contact 108. The contact pad 110 can be a thin layer of conductive metal. The contact pad 110 can cover the bottom of the signal contact 108 and can be planar. The bottom of the signal contact 108 is the surface of the signal contact 108 exposed from the package body 102.

The contact pad 110 can be formed in a number of ways. For example, the contact pad 110 can be formed by a process such as sputtering, electroplating, or chemical vapor deposition (CVD). The contact pad 110 can be made from a metal such as gold, silver, nickel, palladium, an alloy thereof, or another solder-wettable material.

The bond pad 230 is defined as a conductive material on the top of the signal contact 108. The bond pad 230 can be a thin layer of conductive metal. The bond pad 230 can cover only the top of the signal contact 108, which can be embedded in the package body 102. The bond pad 230 can be formed in a number of ways. For example, the bond pad 230 can be formed by a process such as sputtering, electroplating, or chemical vapor deposition (CVD). The bond pad 230 can be made from a metal such as gold, silver, nickel, palladium, or an alloy thereof.

The power bar 106 is defined as a linear conductive structure for carrying current to integrated circuit components or to ground. The power bar 106 includes the power bar body 112, the power bar terminal 114, the terminal pad 116, and a bar bond pad 232. The power bar 106 can be larger in size than the signal contacts 108, and can extend lengthwise parallel to the outline of the integrated circuit packaging system 100. The power bar 106 can be located adjacent to the die paddle 104. The power bar 106 can take many different shapes. For example, the power bar 106 can be a long rectangle, in an L-shape, or in the shape of a hollow square that surrounds the die paddle 104.

The power bar body 112 is defined as the base structure of the power bar 106 from which the power bar terminal 114 can be formed. The power bar body 112 can be made from many different materials such as copper, tin, zinc, or an alloy thereof. The shape of the power bar body 112 is the same as the shape of the power bar 106 without the power bar terminal 114. The power bar body 112 can be embedded in the package body 102.

The power bar terminal 114 is defined as an integral part of the power bar 106 extending from the power bar body 112 that functions as an external connector. The power bar terminal 114 can extend from the power bar body 112 perpendicular to the plane of the package body 102. The power bar terminal 114 can extend from the power bar body 112 at the plane of the package body 102 to the same distance from the package body 102 as the contact body 228. The die paddle pad 220, the terminal pad 116, and the contact pad 110 can all be coplanar at the bottom of the integrated circuit packaging system 100. The power bar terminal 114 can be made from the same materials as the power bar 106.

The power bar terminal 114 can be formed from a portion of the power bar 106 that is covered by the terminal pad 116. The portion of the power bar 106 not embedded in the package body 102 and not covered by the terminal pad 116 can be removed so as to separate instances of the power bar terminal 114. The power bar terminal 114 can be positioned relative to the signal contacts 108 so that the power bar terminal 114 and the signal contacts 108 are in a staggered formation, i.e., the power bar terminal 114 is located so the closest instance of the signal contact 108 is located diagonally from the power bar terminal 114 relative to the sides of the package body 102.

The terminal pad 116 is defined as a conductive material on the bottom of the power bar terminal 114. The terminal pad 116 can be a thin layer of conductive metal. The terminal pad 116 can be selectively located on the surface of the power bar terminal 114 exposed from the package body and parallel to the plane of the package body. The terminal pad 116 can be planar. Instances of the terminal pad 116 can be spaced away from each other.

The terminal pad 116 can be formed in a number of ways. For example, the terminal pad 116 can be formed by a process such as sputtering, electroplating, or chemical vapor deposition (CVD). The terminal pad 116 can be made from a metal such as gold, silver, nickel, palladium, an alloy thereof, or another solder-wettable material. The surfaces of the terminal pad 116 and the power bar 106 not covered by the terminal pad 116 can be unattractive to solder.

The bar bond pad 232 is defined as a conductive material on the top of the power bar 106, which can be embedded in the package body 102. The bar bond pad 232 can be a thin layer of conductive metal. The bar bond pad 232 can be formed in a number of ways. For example, the bar bond pad 232 can be formed by a process such as sputtering, electroplating, or chemical vapor deposition (CVD). The bar bond pad 232 can be made from a metal such as gold, silver, nickel, palladium, or an alloy thereof It has been discovered that the power bar terminal 114 and the signal contacts 108 being positioned in a staggered formation can prevent electrical shorts from solder bridging. For example, the staggered placement of the terminal pad 116 and the signal contacts 108 can increase the spacing between the terminal pad 116 and the signal contacts 108, there is a decreased chance of solder bridging between the terminal pad 116 and the signal contacts 108. The decreasing size of packages coupled with the corresponding decrease in pitch between the power bar 106 and the signal contacts 108 means that staggered contact points for solder can increase reliability without decreasing the effectiveness of the power bar 106.

It has also been discovered that the power bar terminal 114 and the signal contacts 108 being positioned in a staggered formation can allow for a greater density of the signal contacts 108 and structures that function as the power bar 106. For example, because of the decreased risk of solder bridging between the power bar 106 having the power bar terminal 114 and the signal contacts 108, connection structures on the bottom of the integrated circuit packaging system 100 can be packed more closely than if the power bar 106 did not have the power bar terminals 114.

Figure 3:
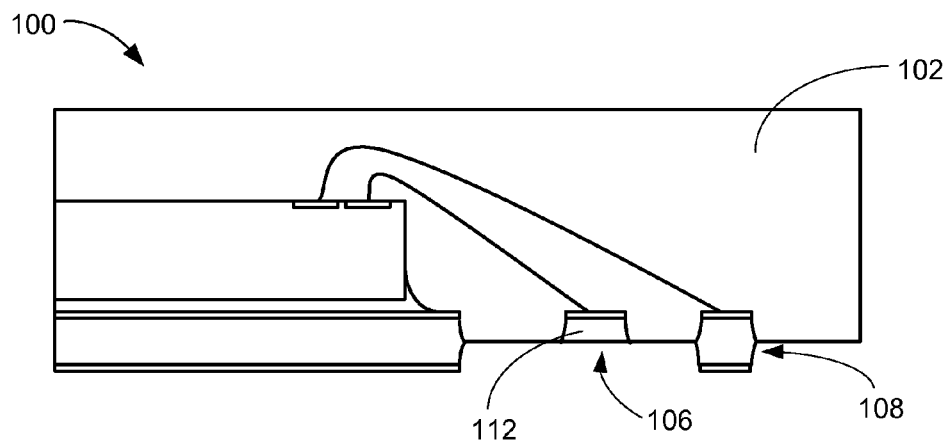
FIG. 3 is a partial cross-sectional view of the integrated circuit packaging system along the section line 3-3 of FIG. 1.

Referring now to FIG. 3, therein is shown a partial cross-sectional view of the integrated circuit packaging system 100 along the section line 3-3 of FIG. 1. The integrated circuit packaging system 100 is shown with all the same features as FIG. 2 except for the power bar terminal 114 of FIG. 2 because the cross-sectional view does not include the power bar terminal 114. Instead, the integrated circuit packaging system 100 is shown with the power bar 106 in a half-removed state.

The power bar 106 can be half-removed by different processes. For example, the power bar body 112 can be removed by a process such as etching, laser ablation, cutting, or shearing. The removal of a portion of the power bar body 112 can create the power bar terminal 114, which can still be at full height. The power bar 106 can be uncoated and unattractive to solder so that a connection to a next level system (not shown) can be only on the power bar terminal 114 and the signal contact 108.

The power bar 106 can be embedded in the package body 102. The exposed portion of the power bar 106 can be coplanar with the bottom of the package body 102. The exposed surface of the power bar body 112 having no protective coating can be coplanar with the bottom surface of the package body 102. The exposed surface of the power bar body 112 can have physical signs of a removal process. For example, if part of the power bar body 112 was removed by an etching process, the surface can be slightly rough due to action of the etchant used.

Figure 4:
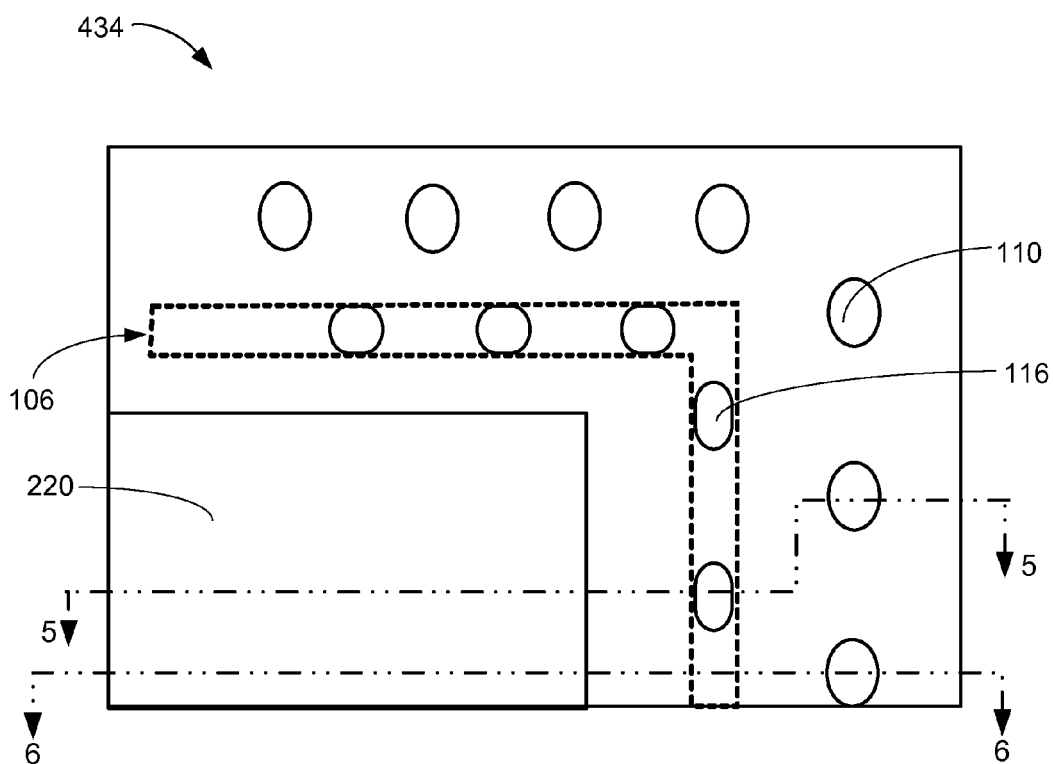
FIG. 4 is a partial plan view of a leadframe in a manufacturing step of the integrated circuit packaging system.

Referring now to FIG. 4, therein is shown a partial plan view of a leadframe 434 in a manufacturing step of the integrated circuit packaging system 100, of FIG. 1. The leadframe 434 is shown having the terminal pad 116, the die paddle pad 220, and the contact pad 110.

The leadframe 434 is defined as a contiguous conductive structure. The leadframe 434 can be processed before further manufacturing steps are performed. For example, the leadframe 434 can have the terminal pad 116, the die paddle pad 220, and the contact pad 110 deposited on it via a process such as sputtering, electroplating, or chemical vapor deposition (CVD). The terminal pad 116, the die paddle pad 220, and the contact pad 110 can be made from a metal such as gold, silver, nickel, palladium, an alloy thereof, or other solder-wettable material. Also for example, in order to assure that the terminal pad 116, the die paddle pad 220, and the contact pad 110 are only deposited where desired, the leadframe 434 can be masked before deposition.

The terminal pad 116, the die paddle pad 220, and the contact pad 110 can be deposited in different sizes and patterns. For example, the die paddle pad 220 can be deposited on the center of the leadframe 434 surrounded by the terminal pad 116 and the contact pad 110. The die paddle pad 220 can be larger in size than the terminal pad 116 and the contact pad 110, and the terminal pad 116 can be closer to the die paddle pad 220 than the contact pad 110.

The terminal pad 116 can be deposited on areas that will become the power bar 106 and the power bar terminal 114 after later processing. The power bar 106 is indicated by the dotted lines. The terminal pads 116 and the contact pads 110 can be deposited in staggered rows. The staggered row pattern can function to allow for closer packing of the terminal pad 116 and the contact pad 110 without the risk of solder bridging; i.e., more instances of the terminal pad 116 and the contact pad 110 can fit into the same amount of space than with, for example, a regular grid pattern.

For illustrative purposes, the terminal pad 116 and the contact pad 110 are shown as generally round or oval-shaped, though it is understood that the terminal pad 116 and the contact pad 110 can be shaped differently. For example, the terminal pad 116 and the contact pad 110 can be circular, in the shape of a square, rectangular, or some other regular geometric shape.

Figure 5:
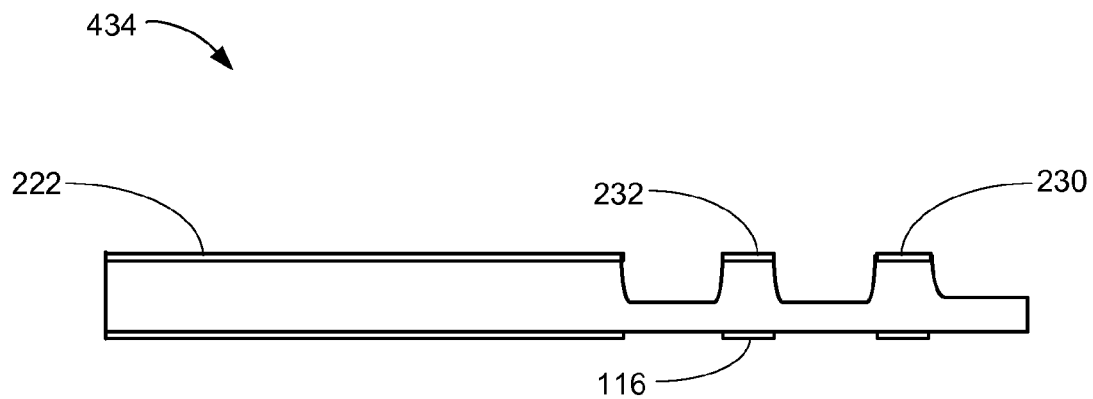
FIG. 5 is a partial cross-sectional view of the leadframe along the section line 5-5 of FIG. 4.

Referring now to FIG. 5, therein is shown a partial cross-sectional view of the leadframe 434 along the section line 5-5 of FIG. 4. The leadframe 434 is shown with all the same features as in FIG. 4, but with the structure of the top of the leadframe 434 shown as well. The leadframe 434 is shown with the terminal pad 116. The top of the leadframe 434 can be processed in various ways. For example, the leadframe 434 can be etched before further processing. Before etching, the bond pad 230, the bar bond pad 232, and the die attach pad 222 can be applied to the top of the leadframe 434.

The bond pad 230, the bar bond pad 232, and the die attach pad 222 can resist the etching process and the leadframe 434 can be partially etched through the top surface of the leadframe 434, leaving recesses in the leadframe 434 between the areas covered by the bond pad 230, the bar bond pad 232, and the die attach pad 222. For example, the recesses can be of a depth so half the thickness of the leadframe 434 remains between the bottom of the recess and the component side of the leadframe 434.

Figure 6:
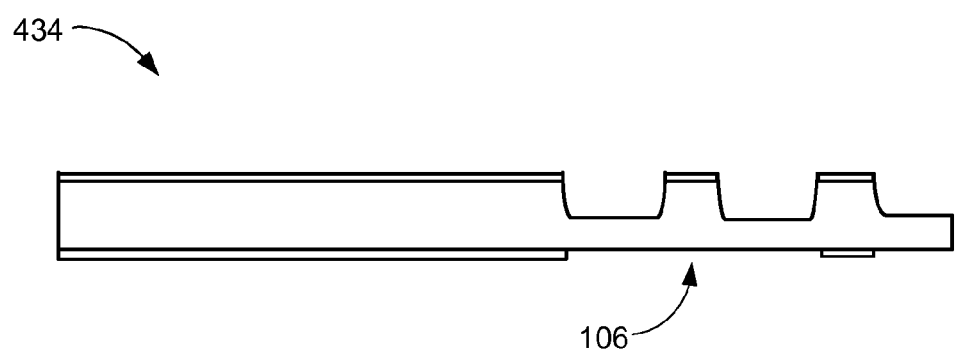
FIG. 6 is a partial cross-sectional view of the leadframe along the section line 6-6 of FIG. 4.

Referring now to FIG. 6, therein is shown a partial cross-sectional view of the leadframe 434 along the section line 6-6 of FIG. 4. The leadframe 434 is shown having all the same features as FIG. 5, but without the terminal pad 116 of FIG. 1 because of where the cross-section is taken from. The unplated section of the power bar 106 can be partially removed after encapsulation and during a removal process such as etching, laser ablation, or cutting.

Figure 7:
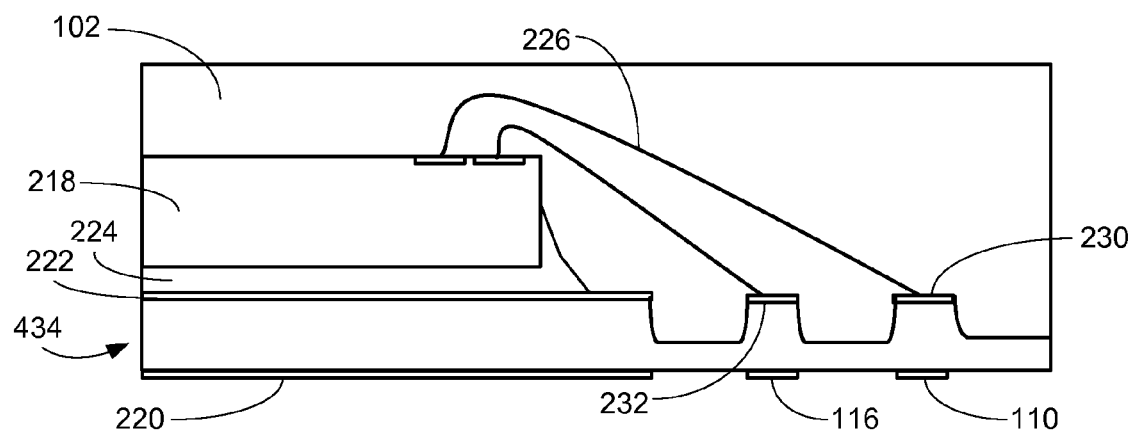
FIG. 7 is the structure of FIG. 5 after encapsulation in a further manufacturing step of the integrated circuit packaging system.

Referring now to FIG. 7, therein is shown the structure of FIG. 5 after encapsulation in a further manufacturing step of the integrated circuit packaging system 100, of FIG. 1. The leadframe 434 is shown with the package body 102 molded to the component side of the leadframe 434.

The integrated circuit die 218 can be connected to the bond pad 230 and the bar bond pad 232 with the bond wires 226. The bond wires 226 can be attached to the active side of the integrated circuit die 218. The integrated circuit die 218 can be mounted on the die attach pad 222 with the die attach adhesive 224.

The package body 102 can be molded over and encapsulate different components. For example, the package body 102 can cover the integrated circuit die 218, the bond wires 226, and the component side of the leadframe 434. The package body 102 can contact the die attach adhesive 224. Because further processing is necessary to create holes in the leadframe 434, the system side of the leadframe 434 having the terminal pad 116, the contact pad 110, and the die paddle pad 220 can be completely exposed and not covered by the package body 102.

Figure 8:
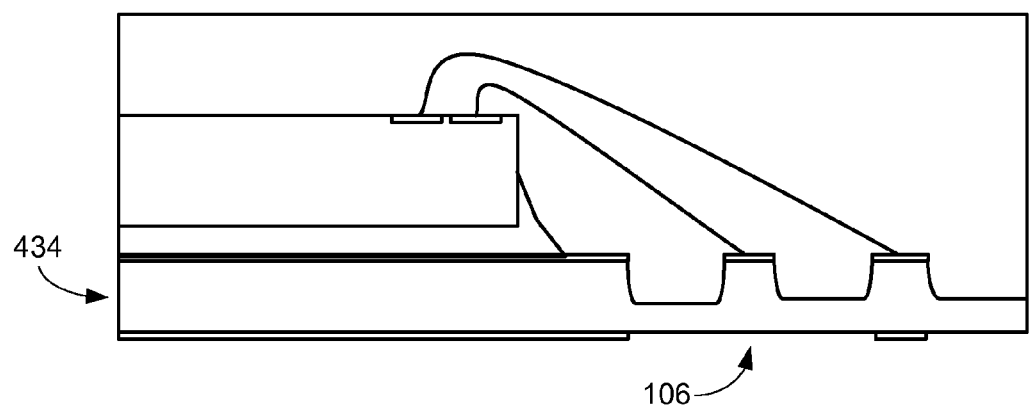
FIG. 8 is the structure of FIG. 6 after encapsulation in a further manufacturing step of the integrated circuit packaging system.

Referring now to FIG. 8, therein is shown the structure of FIG. 6 after encapsulation in a further manufacturing step of the integrated circuit packaging system 100, of FIG. 1. All the features of FIG. 7 are shown except for the terminal pad 116 of FIG. 1 because of where the cross-section is taken from. The unplated section of the power bar 106 can be partially removed during a removal process such as etching, laser ablation, or cutting. The terminal pad 116 can protect selected sections of the power bar 106 from an etching process at the system side of the leadframe 434.

Figure 9:
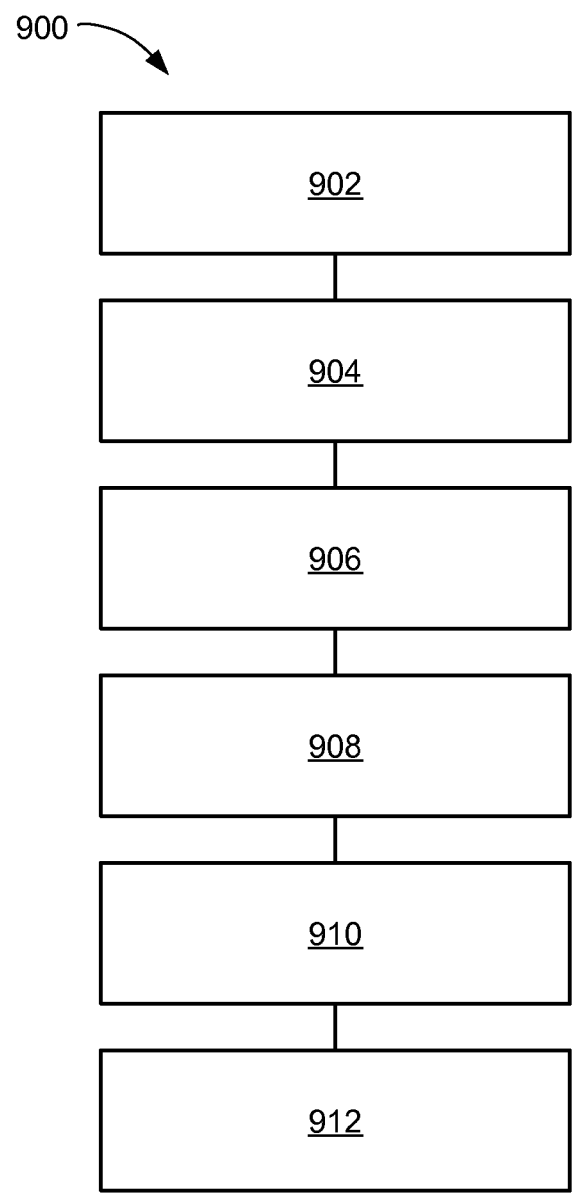
FIG. 9 is a flow chart of a method of manufacture of the integrated circuit packaging system in a further embodiment of the present invention.

Referring now to FIG. 9, therein is shown a flow chart of a method 900 of manufacture of the integrated circuit packaging system in a further embodiment of the present invention. The method 900 includes: forming signal contacts in a block 902; forming a power bar having a power bar terminal, the power bar terminal formed in a staggered position relative to the signal contacts in a block 904; depositing a terminal pad on the power bar terminal in a block 906; depositing a contact pad on the signal contacts in a block 908; coupling an integrated circuit die to the power bar terminal and the signal contacts in a block 910; and forming a package body on the integrated circuit die in a block 912.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing multi-row quad flatpack no-lead integrated circuit packaging systems fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
    forming signal contacts;

forming a power bar having a power bar terminal, the power bar terminal formed in a staggered position relative to the signal contacts;

depositing a terminal pad and another of the terminal pad on and along the power bar and directly on the power bar terminal, the terminal pad and another of the terminal pad formed in a staggered position relative to the signal contacts;

depositing a contact pad on one of the signal contacts;

coupling an integrated circuit die to the power bar terminal and the signal contacts; and forming a package body on the integrated circuit die, the power bar, and the signal contacts including exposing the power bar terminal and the signal contact from the package body includes exposing a power bar body to be exposed from and coplanar with a bottom surface of the package body.

2. The method as claimed in claim 1 further comprising:
forming a die paddle adjacent to the power bar; and
depositing a die attach pad and a die paddle pad on the die paddle.

3. The method as claimed in claim 1 further comprising:
depositing a bond pad on one of the signal contacts; and
connecting bond wires between the integrated circuit die and the bond pad.

4. The method as claimed in claim 1 wherein forming the signal contacts includes removing a portion of a leadframe between the terminal pad and the contact pad.

5. The method as claimed in claim 1 further comprising:
depositing a bar bond pad on the power bar terminal; and
connecting bond wires between the integrated circuit die and the bar bond pad.

6. A method of manufacture of an integrated circuit packaging system comprising:
forming signal contacts;
forming a power bar having a power bar terminal, the power bar terminal formed in a staggered position relative to the signal contacts;
forming a die paddle;
depositing a terminal pad and another of the terminal pad on and along the power bar and directly on the power bar terminal, the terminal pad and another of the terminal pad formed in a staggered position relative to the signal contacts;
depositing a contact pad and a bond pad on one of the signal contacts;
depositing a die attach pad and a die paddle pad on the die paddle;
connecting bond wires between the integrated circuit die and the bond pad and the bar bond pad; and
forming a package body on the integrated circuit die, the power bar, and the signal contacts including exposing the power bar terminal and the signal contact from the package body includes exposing a power bar body to be exposed from and coplanar with a bottom surface of the package body.

7. The method as claimed in claim 6 further comprising:
applying a die attach adhesive on the die attach pad; and
positioning the integrated circuit die on the die attach adhesive.

8. The method as claimed in claim 6 further comprising forming a plurality of the power bar terminal around the die paddle, the plurality of the power bar terminal and the signal contacts formed in staggered rows.

9. The method as claimed in claim 6 wherein coupling the integrated circuit die to the signal contacts includes connecting a wire-bond die to the signal contacts.

10. The method as claimed in claim 6 wherein forming the power bar includes half-etching portions of the power bar not covered by the terminal pad.

\* \* \* \* \*